United States Patent
Huang et al.

(10) Patent No.: US 6,688,379 B2
(45) Date of Patent: Feb. 10, 2004

(54) HEAT DISSIPATION DEVICE WITH HIGH EFFICIENCY

(75) Inventors: Wen-Shi Huang, Taoyuan Sien (TW); Bor Haw Chang, Taoyuan Sien (TW); Yu-Hung Huang, Taoyuan Sien (TW)

(73) Assignee: Delta Electronics, Inc., Taoyuan Sien (TW)

( * ) Notice: Subject to any disclaimer, the term of this patent is extended or adjusted under 35 U.S.C. 154(b) by 0 days.

(21) Appl. No.: 10/145,476

(22) Filed: May 14, 2002

(65) Prior Publication Data

US 2003/0000684 A1 Jan. 2, 2003

(30) Foreign Application Priority Data

Jun. 13, 2001 (TW) .................................. 90209813 U

(51) Int. Cl.⁷ ................................................. F24H 3/02
(52) U.S. Cl. .................. 165/121; 165/104.33; 361/697; 361/704; 257/706; 257/722; 174/16.3
(58) Field of Search .................. 165/80.3, 185, 165/121, 122; 361/695, 697, 704, 710; 257/706, 722; 454/184; 174/16.3

(56) References Cited

U.S. PATENT DOCUMENTS

| | | | | |
|---|---|---|---|---|
| 6,005,770 A | * | 12/1999 | Schmitt | 361/695 |
| 6,031,717 A | * | 2/2000 | Baddour et al. | 361/687 |
| 6,042,348 A | * | 3/2000 | Aakalu et al. | 417/423.5 |
| 6,122,169 A | * | 9/2000 | Liu et al. | 361/700 |
| 6,135,875 A | * | 10/2000 | French | 454/184 |
| 6,155,920 A | * | 12/2000 | Pan et al. | 454/184 |
| 6,174,232 B1 | * | 1/2001 | Stoll et al. | 454/184 |
| 6,176,299 B1 | * | 1/2001 | Hanzlik et al. | 165/80.3 |
| 6,181,557 B1 | * | 1/2001 | Gatti | 361/695 |
| 6,244,331 B1 | * | 6/2001 | Budelman | 165/80.3 |
| 2003/0015311 A1 | * | 1/2003 | Lin et al. | 165/80.3 |

\* cited by examiner

*Primary Examiner*—Terrell L McKinnon
(74) *Attorney, Agent, or Firm*—Thomas, Kayden, Horstemeyer & Risley

(57) ABSTRACT

The heat dissipation device includes a frame and an impeller. The frame has an inlet and an outlet, in which the inlet has a noncircular shape. The inlet can be provided with a blocking board so as to be noncircular. The blocking board suppresses airflow dissipated from a high pressure region of the airflow path in order to enhance outgoing airflow.

18 Claims, 5 Drawing Sheets

HEAT DISSIPATION DEVICE WITH HIGH EFFICIENCY

BACKGROUND OF THE INVENTION

1. Field of the Invention

The present invention relates to a heat dissipation device, and particularly to a heat dissipation module with high heat-dissipating efficiency.

2. Description of the Related Art

FIG. 1(a) shows a conventional fan, which has a frame 10 and an impeller 20. The frame 10 has a circular inlet 11, which matches with the impeller 20, and an outlet 12. The impeller 20 has a hub 21, a base 22 and a plurality of blades 23 radially arranged on the base 22. The blades 23 transform the axial incoming airflow to the radial outgoing airflow of the fan.

With the increasing efficiency of electronic elements, the outgoing airflow can be enhanced by enlargement of airflow path of the fan in order to improve heat dissipation efficiency. However, there is space limitation to the airflow path, and the outgoing airflow 13 in the outlet 12 and the incoming airflow in the inlet 11 interfere with each other due to backflow 14 as shown in FIG. 1(b), which leads to annoying noise and reduced outgoing airflow.

Consequently, a fan with improved heat dissipation efficiency is required to enhance the outgoing airflow and to solve the aforementioned problem.

SUMMARY OF THE INVENTION

In view of this, the present invention discloses a heat dissipation device with a particularly designed inlet.

The present invention discloses a heat dissipation device to prevent interference between the incoming airflow and the outgoing airflow at the inlet and outlet. With the heat dissipation device of the present invention, the outgoing airflow is significantly enhanced, thus improving the heat-dissipating efficiency.

The first embodiment of the present invention includes a frame and an impeller. The impeller is disposed in a concave of the frame. In a further embodiment, the impeller has a hub, a base and a plurality of blades radially arranged on the base. The blades transform the axial incoming airflow to the radial outgoing airflow of the heat dissipation device.

The frame has an inlet and an outlet. That is, the frame constitutes a bracket and a cover, in which the inlet is formed, and the outlet formed on the bracket. It should be noted that a blocking board is provided in a high pressure region of the airflow path of the present invention defined by the inlet, the concave of the frame and the outlet, and the high pressure region is at the end of the airflow path. That is, the blocking board is provided at a position where the inlet adjoins the outlet, so that the inlet is noncircular.

The second embodiment of the present invention discloses a heat dissipation module, which includes a centrifugal fan or a blower. The heat dissipation module is provided to adjoin a heat source. The heat dissipation module includes a frame and an impeller, in which the frame has an outlet and a noncircular inlet. Further, the frame is selectively provided with a cover.

The impeller can be a centrifugal fan or a blower. In this embodiment, the impeller has a hub, a base and a plurality of blades formed on the base. The impeller is disposed in a concave of the frame, wherein the airflow path refers to a path from the inlet to the outlet through the concave of the frame. The blades transform the axial incoming airflow to the radial outgoing airflow of the heat dissipation module.

Similar to the first embodiment, the second embodiment of the present invention has a blocking board provided in a high pressure region of the airflow path, and the high pressure region is at the end of the airflow path. That is, the blocking board is provided at a position where the inlet adjoins the outlet, so that the inlet is noncircular. The blocking board suppresses air backflow from the inlet, so that outgoing airflow is further enhanced at the outlet.

Further, the heat dissipation module has a heat conduction plate, which is extended from a side surface of the frame. Thus, the heat source such as a CPU can be placed on the heat conduction plate for adjoining to the heat dissipation module. Further, the outlet of the heat dissipation module is provided with a plurality of cooling fins, and the heat conduction plate is provided with a heat pipe adjoining the heat source to conduct heat from the heat source to the cooling fins.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

The present invention discloses a heat dissipation device to prevent interference between the incoming airflow and the outgoing airflow at the inlet and outlet. With the heat dissipation device of the present invention, the outgoing airflow is significantly enhanced, thus improving heat dissipating efficiency. It should be noted beforehand that, while the present invention is described hereinafter in preferred embodiments that are utilized in a centrifugal fan, a blower or a heat dissipation module, the present invention is not limited to these constructions.

The First Embodiment

The first embodiment of the present invention is a centrifugal fan or a blower.

Figure 1A:
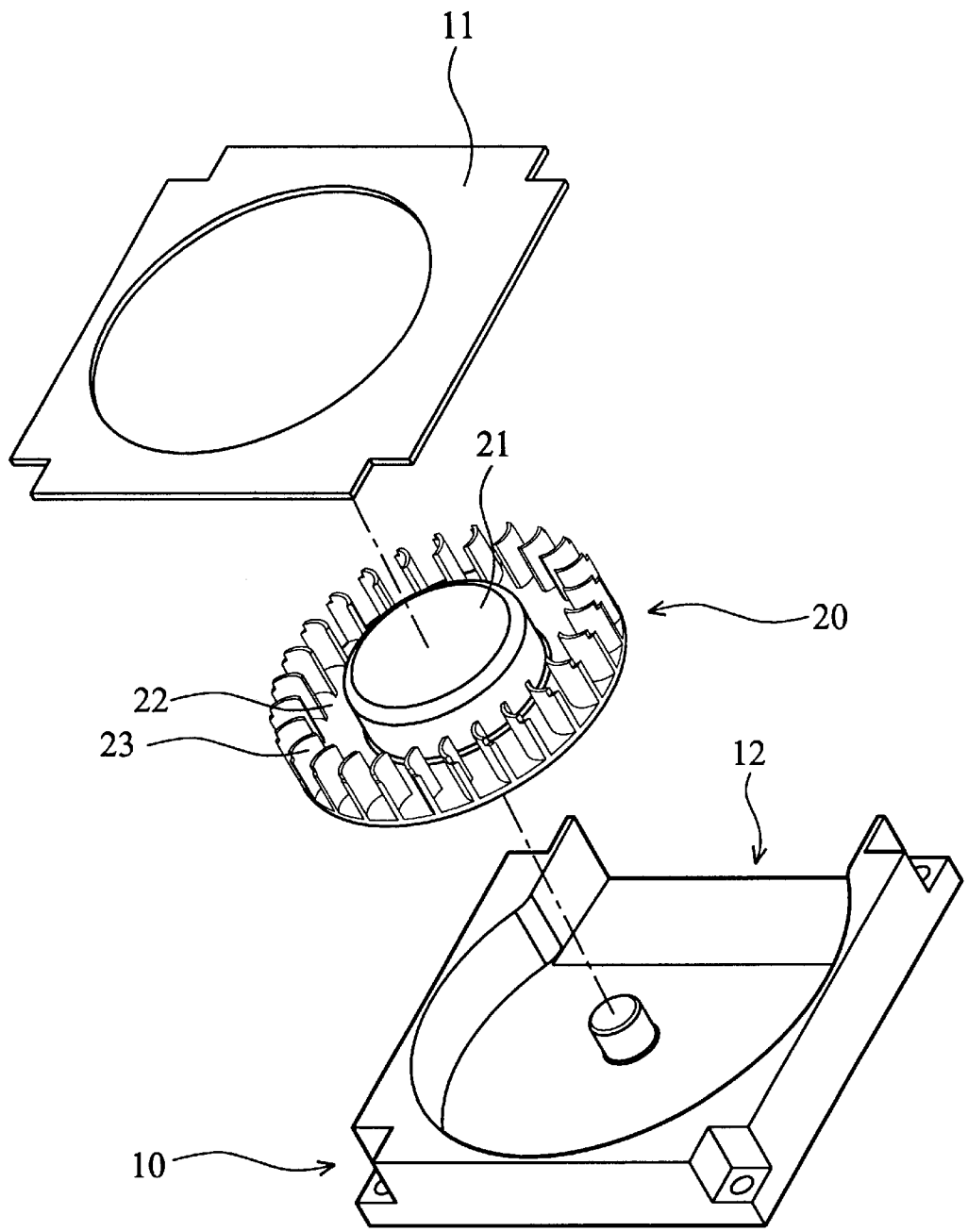
FIG. 1(a) is a disassembled view of a conventional fan.
Figure 1B:
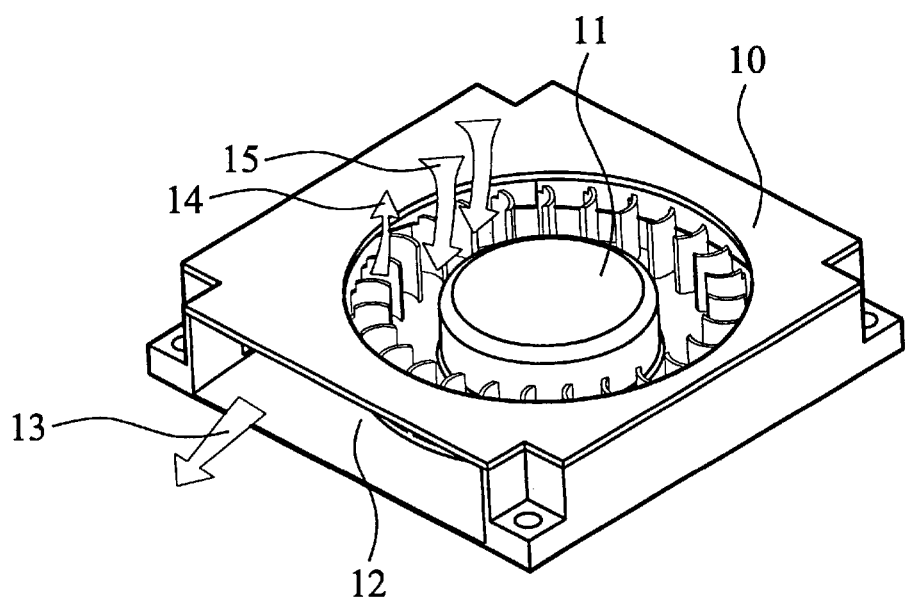
FIG. 1(b) is a schematic view of the conventional fan in FIG. 1(a)
Figure 2:
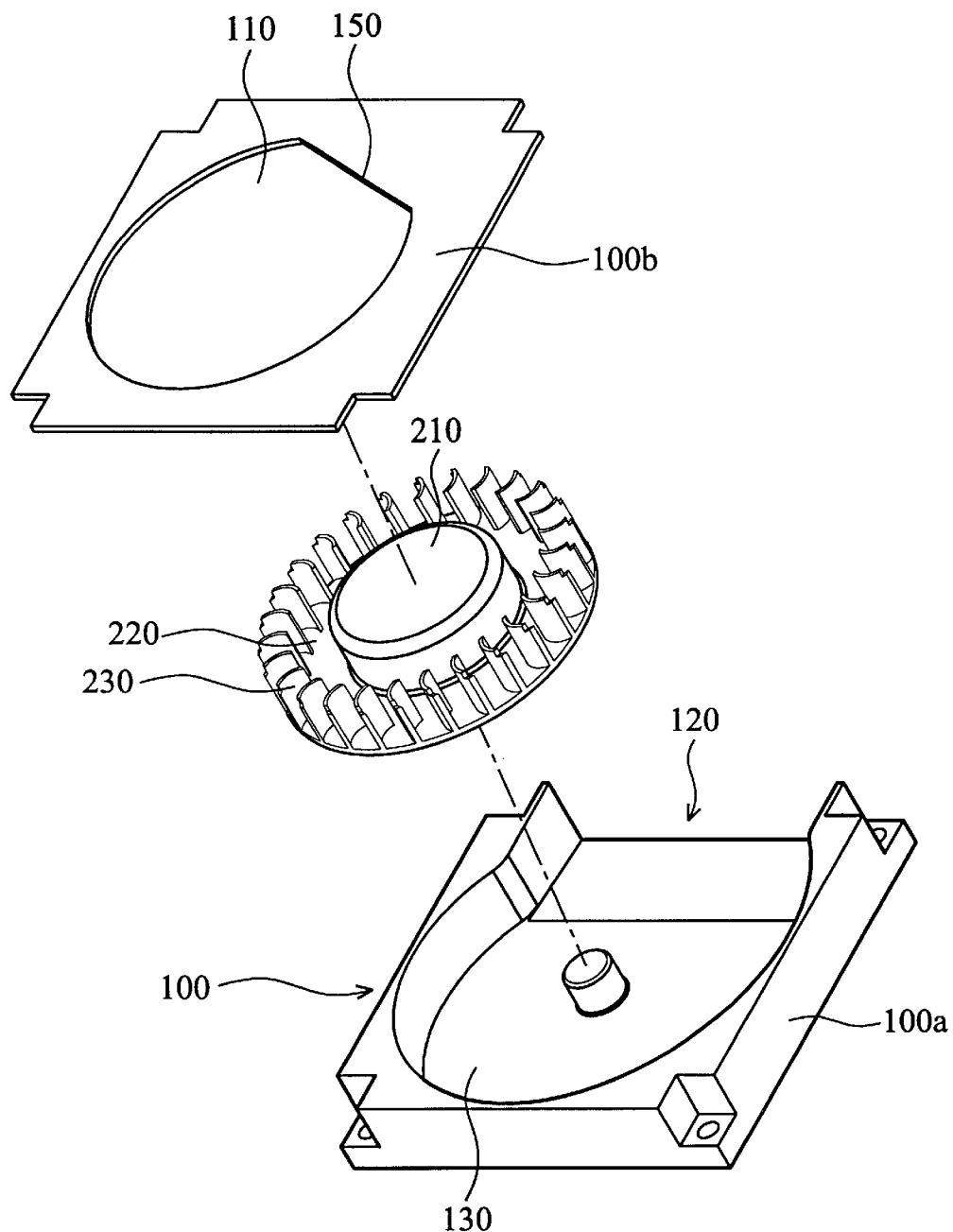
FIG. 2 is a disassembled view of the first embodiment of the present invention.
Figure 3:
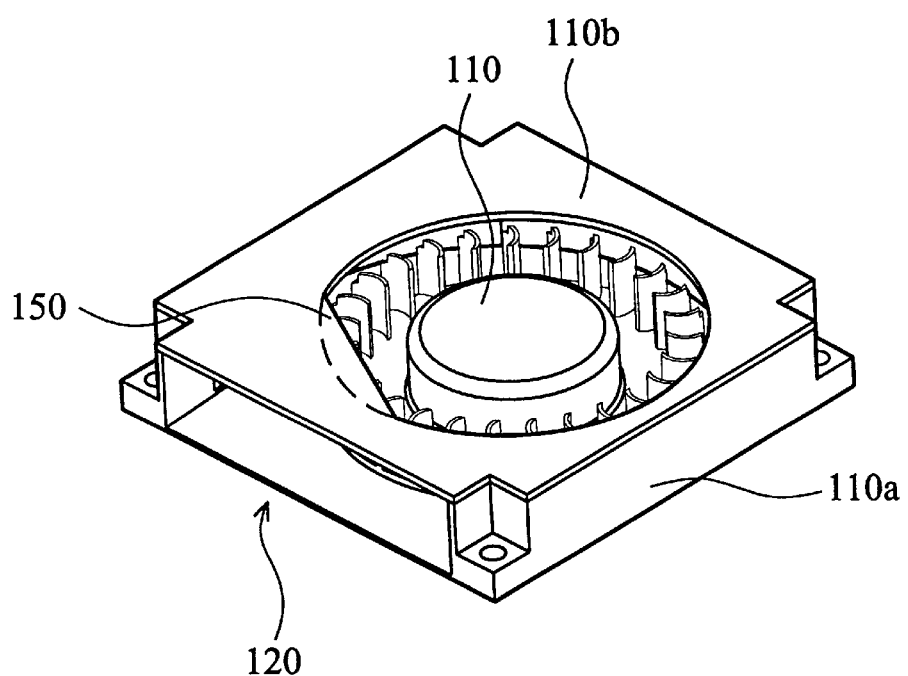
FIG. 3 is a perspective view of the first embodiment of the present invention.

The first embodiment is described with reference to FIG. 2 and FIG. 3, in which FIG. 2 is a disassembled view, and FIG. 3 is a perspective view. The heat dissipation device of the present invention has a frame 100 and an impeller 200. The impeller 200 is disposed in a concave 130 of the frame 100. The airflow path refers to a path from the inlet to the outlet through the concave of the frame. In this embodiment, the impeller 200 is a centrifugal fan, which has a hub 210, a base 220 and a plurality of blades 230 formed on the base 220. The blades 230 transform the axial incoming airflow to the radial outgoing airflow of the heat dissipation device. In addition, each blade has a cutaway portion to create a stepped portion formed radially outwardly on each blade to further reduce the noise generated during the operating process.

Further, the frame 100 has an inlet 110 and an outlet 120, as shown in FIG. 2 and FIG. 3. That is, the frame 100 is composed of a bracket 100a and a cover 100b, in which the inlet 110 is formed on the cover 100b, and the outlet 120 is formed on the bracket 100a. It should be noted that a blocking board 150 is provided in a high pressure region of the airflow path in this embodiment, and the high pressure region is at the end of the airflow path. That is, the blocking board 150 (shown in dotted line) is provided at a position where the inlet 110 adjoins the outlet 120, so that the inlet 110 is noncircular.

It is known by experience that backflow toward the inlet occurs at the high pressure region near the outlet, which leads to interference with the incoming airflow. As a result, the blocking board 150 of the present invention prevents the backflow toward the inlet 110, so that outgoing airflow is further enhanced. Experiments show that the heat dissipation device of the present invention increases the outgoing airflow volume at a rate of at least 20% more than that of the conventional fan with similar size. Thus, the heat dissipation device of the present invention may reach the same outgoing airflow volume with a lower rotational speed, which reduces the annoying noise.

Table 1 shows the maximum flow rate data of the heat dissipation device of the present invention in comparison to the conventional fan.

TABLE 1

|  | The present invention | Conventional fan |
| --- | --- | --- |
| Rotational speed (rpm) | 4000 | 4000 |
| Qmax (CMM) | 0.154 | 0.125 |

From Table 1, it is inferred that the conventional fan has to increase the rotational speed to about 4900 rpm to obtain the same maximum flow rate Qmax. Consequently, the data proves that the present invention provides increased outgoing airflow volume with a relatively lower rotational speed.

The Second Embodiment

Figure 4:
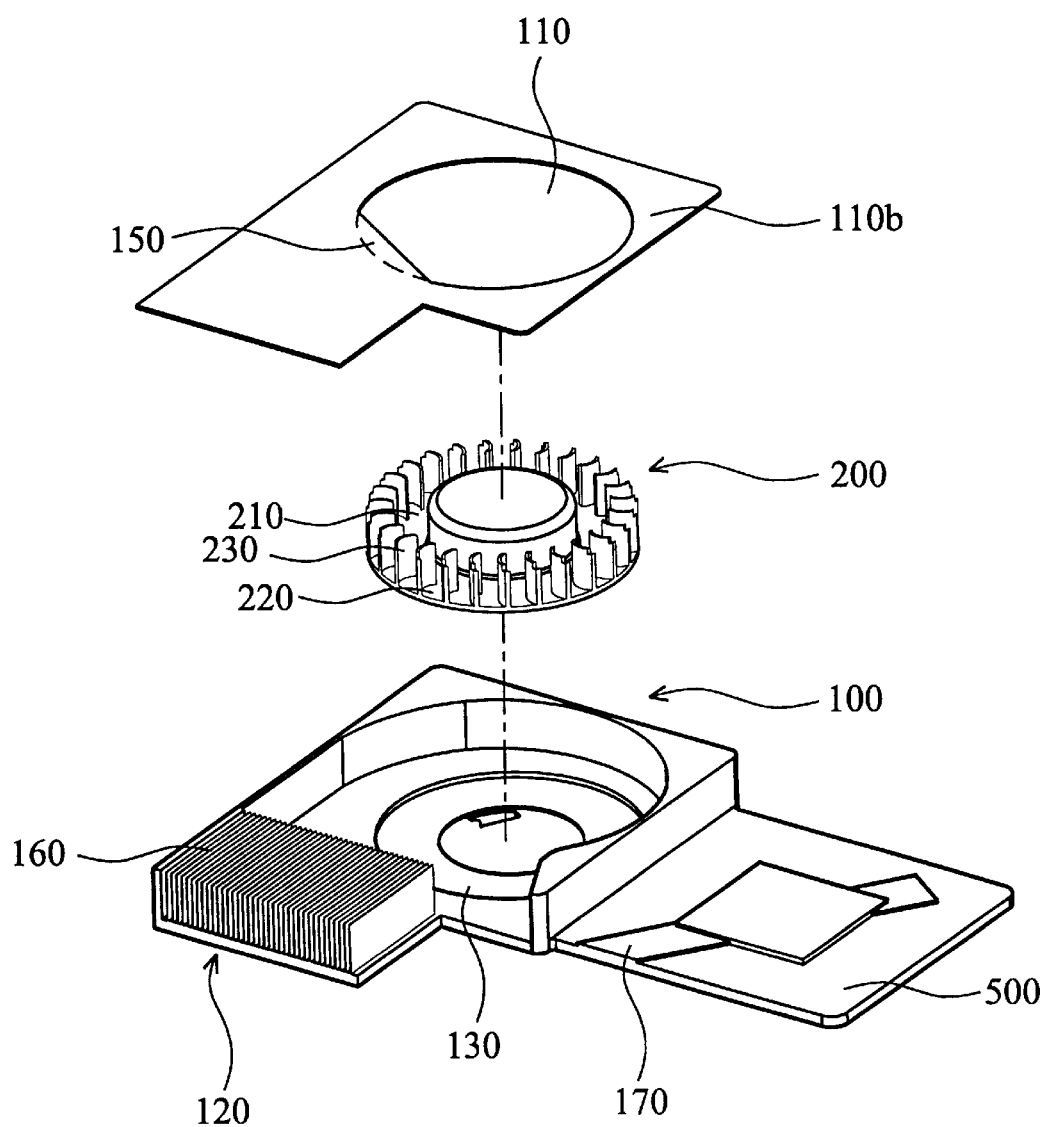
FIG. 4 is a disassembled view of the second embodiment of the present invention.

The second embodiment of the present invention discloses a heat dissipation module, which includes a centrifugal fan or a blower. FIG. 4 shows a scheme of the second embodiment of the present invention. The heat dissipation module is provided to adjoin a heat source, such as a CPU (not shown). The heat dissipation module includes a frame 100 and an impeller 200, in which the frame 100 has an outlet 120 and a noncircular inlet 110. Further, the frame 100 is selectively provided with a cover 100b and can be made of metal, such as aluminum or aluminum alloy.

The impeller 200 in FIG. 4 can be an axial-flow fan, a centrifugal fan or a blower, not limited hereinafter. In this embodiment, the impeller 200 is a centrifugal fan, which has a hub 210, a base 220, and a plurality of blades 230 formed on the base 220. The impeller 200 is disposed in a concave 130 of the frame 100, in which the airflow path refers to a path from the inlet 110 to the outlet 120 through the concave of the frame. The blades 230 transform the axial incoming airflow to the radial outgoing airflow of the heat dissipation module.

Similar to the first embodiment, the second embodiment of the present invention as shown in FIG. 4 has a blocking board 150 provided in a high pressure region of the airflow path, and the high pressure region is at the end of the airflow path. That is, the blocking board 150 (shown in dotted line) is provided at a position where the inlet 110 adjoins the outlet 120, so that the inlet 110 is noncircular. The blocking board 150 suppresses air backflow from the inlet 110, so that outgoing airflow is further enhanced at the outlet 120.

Further, the heat dissipation module has a heat conduction plate 500, which is extended from a side surface of the frame 100. Thus, the heat source, such as a CPU, can be placed on the heat conduction plate for adjoining to the heat dissipation module, and the heat conduction plate 500 absorbs heat from the heat source. Further, the outlet 110 of the heat dissipation module is provided with a plurality of cooling fins 160. The cooling fins 160 in this embodiment are made of metal, such as aluminum or aluminum alloy. Further, the heat conduction plate 500 is provided with a heat pipe 170 adjoining the heat source (not shown) to conduct heat of the heat source to the cooling fins 160. Thus, the heat is dissipated with airflow driven by the impeller 200.

While the present invention has been described with reference to the preferred embodiments thereof, it is to be understood that the invention is not limited to the described embodiments or constructions. On the contrary, the invention is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A heat dissipation device, comprising:
   a frame having an inlet and an outlet;
   an impeller disposed in the frame; and
   a blocking board formed inside the inlet where the inlet adjoins the outlet to determine a non circular shape of the inlet and suppress reverse airflow out from the inlet.

2. A heat dissipation module, provided to adjoin a heat source, the heat dissipation module comprising:
   a frame having an outlet and a noncircular inlet;
   a blade impeller disposed in the frame; and
   a blocking board disposed inside the inlet where the inlet adjoins the outlet to determine a non circular shape of the inlet and suppress backward outgoing airflow.

3. The heat dissipation module according to claim 2, further comprising a heat conduction plate extended from a side of the frame.

4. The heat dissipation module according to claim 3, wherein the outlet is provided with a plurality of cooling fins.

5. The heat dissipation module according to claim 4, further comprising a heat pipe provided on the heat conduction plate to adjoin the heat source to conduct heat from the heat source to the cooling fins.

6. The heat dissipation module according to claim 2, wherein the blocking board determines the noncircular inlet.

7. The heat dissipation module according to claim 2, wherein the frame further comprises a cover for forming the inlet thereon.

8. The heat dissipation module according to claim 7, wherein the frame and the cover are made of metal.

9. A heat dissipation device, comprising a frame and an impeller, the frame having an inlet and an outlet, the heat dissipation device being characterized in that:
   the inlet is provided with a blocking board formed inside the inlet where the inlet adjoins the outlet to determine a non circular shape of the inlet.

10. The heat dissipation device according to claim 9, wherein the impeller is disposed in a concave of the frame.

11. The heat dissipation device according to claim 9, wherein the frame further comprises a cover for forming the inlet thereon.

12. A heat dissipation module, provided to adjoin a heat source, the heat dissipation module comprising:
- a frame having an outlet and a noncircular inlet;
- a blade impeller disposed in the frame; and
- a heat conduction plate extending from a side of the frame.

13. The heat dissipation module according to claim 12, wherein the outlet is provided with a plurality of cooling fins.

14. The heat dissipation module according to claim 13, further comprising a heat pipe provided on the heat conduction plate to adjoin the heat source to conduct heat from the heat source to the cooling fins.

15. The heat dissipation module according to claim 12, further comprising a blocking board where the inlet adjoins the outlet to suppress outgoing airflow.

16. The heat dissipation module according to claim 15, wherein the blocking board determines the noncircular inlet.

17. The heat dissipation module according to claim 12, wherein the frame further comprises a cover for forming the inlet thereon.

18. The heat dissipation module according to claim 17, wherein the frame and the cover are made of metal.

* * * * *